United States Patent
Kawoosa et al.

(10) Patent No.: US 9,347,991 B1
(45) Date of Patent: May 24, 2016

(54) SCAN THROUGHPUT ENHANCEMENT IN SCAN TESTING OF A DEVICE-UNDER-TEST

(71) Applicant: TEXAS INSTRUMENTS INCORPORATED, Dallas, TX (US)

(72) Inventors: Mudasir Shafat Kawoosa, Srinagar (IN); Rajesh Kumar Mittal, Bangalore (IN); Sreenath Narayanan Potty, Trivandrum (IN)

(73) Assignee: Texas Instruments Incorporated, Dallas, TX (US)

( * ) Notice: Subject to any disclaimer, the term of this patent is extended or adjusted under 35 U.S.C. 154(b) by 22 days.

(21) Appl. No.: 14/539,555

(22) Filed: Nov. 12, 2014

(51) Int. Cl.
*G01R 31/28* (2006.01)
*G01R 31/3177* (2006.01)
*G11C 29/12* (2006.01)

(52) U.S. Cl.
CPC ............ *G01R 31/3177* (2013.01); *G01R 31/28* (2013.01); *G11C 29/12* (2013.01)

(58) Field of Classification Search
CPC ............... G01R 31/3177; G01R 31/28; G01R 31/318536; G11C 29/12; G11C 29/48
USPC .......... 714/726–729, 731, 734–735, 738, 744
See application file for complete search history.

(56) References Cited

U.S. PATENT DOCUMENTS

| | | | | |
|---|---|---|---|---|
| 5,889,936 A | * | 3/1999 | Chan | G01R 31/31935 714/39 |
| 6,744,272 B2 | * | 6/2004 | Ernst | G11C 29/48 324/750.3 |
| 7,249,298 B2 | * | 7/2007 | Sim | G01R 31/2891 714/726 |
| 8,627,161 B2 | * | 1/2014 | Whetsel | G01R 31/31721 714/729 |

* cited by examiner

*Primary Examiner* — Christine Tu
(74) *Attorney, Agent, or Firm* — Lawrence J. Bassuk; Frank D. Cimino

(57) ABSTRACT

Systems and methods for enabling scan testing of device-under-test (DUT) are disclosed. In an embodiment, a test system for scan testing the DUT, including P scan input ports and Q scan output ports, includes tester and adapter module. Tester operates at clock frequency F1 and includes M tester Input/Output (I/O) ports for providing M scan inputs and N tester I/O ports for receiving N scan outputs at F1. Adapter module is coupled to tester and configured to receive M scan inputs at F1 and, in response, provide P scan inputs at clock frequency F2 to P scan input ports, and to receive Q scan outputs at F2 from Q scan output ports and, in response, provide N scan outputs at F1 to N tester I/O ports, where ratio of M to P equals ratio of N to Q, and where each of M, N, P and Q are positive integers.

20 Claims, 4 Drawing Sheets

US 9,347,991 B1

SCAN THROUGHPUT ENHANCEMENT IN SCAN TESTING OF A DEVICE-UNDER-TEST

TECHNICAL FIELD

The present disclosure generally relates to the field of scan testing of a device-under-test (DUT).

BACKGROUND

Testing of a device-under-test (DUT) is an integral step in a manufacturing process of the DUT. The DUT can be tested using a tester that includes a plurality of Input/Output (I/O) ports. Examples of the tester can include a very low cost tester (VLCT) or a high-end tester. Scan testing is one technique used for testing the DUT and involves shifting of data by a plurality of scan chains between a decompressor and a compressor of the DUT. Typically, the scan testing includes decompression of the data, for example external scan inputs to the DUT, by the decompressor into a plurality of scan chains or inputs and compression of the data, for example a plurality of scan outputs, by the compressor into a limited number of external scan outputs. If the DUT is a low pin count design, the DUT is more prone to aliasing errors and the compression of the data is less robust as number of scan chains is less due to limited number of external scan inputs and external scan outputs.

To increase the number of external scan inputs to the decompressor and to increase the number of external scan outputs from the compressor, a serializer-deserializer (SerDes) is included in the DUT. However, tester resources (the I/O ports) of the tester still remain under-utilized, causing reduced tester data rate and increased testing time.

SUMMARY

This summary is provided to introduce a selection of concepts in a simplified form that are further described below in the detailed description. This summary is not intended to identify key or essential features of the claimed subject matter, nor is it intended to be used as an aid in determining the scope of the claimed subject matter.

Various systems and methods for scan testing a device-under-test (DUT) are disclosed. A test system for scan testing a device-under-test (DUT), the DUT comprising P scan input ports and Q scan output ports, includes a tester and an adapter module. The tester operates at a clock frequency F1 and includes M tester Input/Output (I/O) ports for providing M scan inputs at the clock frequency F1. The tester further includes N tester I/O ports for receiving N scan outputs at the clock frequency F1. The adapter module is coupled to the tester and is configured to receive the M scan inputs at the clock frequency F1 and provide P scan inputs at a clock frequency F2 to the P scan input ports of the DUT. The P scan inputs are provided in response to the M scan inputs. The adapter module is further configured to receive Q scan outputs at the clock frequency F2 from the Q scan output ports of the DUT and provide N scan outputs at the clock frequency F1 to the N tester I/O ports of the tester. The N scan outputs are provided in response to the Q scan outputs. A ratio of M to P is equal to a ratio of N to Q, and each of M, N, P and Q is a positive integer.

In another embodiment, a method of enabling scan testing of a device-under-test (DUT), the DUT comprising P scan input ports and Q scan output ports, is disclosed. The method includes receiving M scan inputs at a plurality of input ports of an adapter module. The M scan inputs are received from M tester Input/Output (I/O) ports of a tester at a clock frequency F1. The method includes providing P scan inputs to the P scan input ports of the DUT at a clock frequency F2. The P scan inputs are provided in response to the M scan inputs. The method further includes receiving Q scan outputs at a plurality of output ports of the adapter module. The Q scan outputs are received from the Q scan output ports of the DUT at the clock frequency F2. Additionally, the method includes providing N scan outputs to N tester I/O ports of the tester at the clock frequency F1. The N scan outputs are provided in response to the Q scan outputs.

In another embodiment, an adapter module for enabling scan testing of a device-under-test (DUT), the DUT comprising P input ports and Q scan output ports, is disclosed. The adapter module includes a plurality of input ports, a plurality of output ports, and a clock generating unit. The plurality of input ports are configured to receive M scan inputs at a clock frequency F1 from M tester Input/Output (I/O) ports of a tester, and to receive Q scan outputs at a clock frequency F2 from the Q scan output ports of the DUT. The plurality of output ports are configured to provide P scan inputs at the clock frequency F2 to the P scan input ports of the DUT in response to the M scan inputs, and to provide N scan outputs at the clock frequency F1 to N tester I/O ports of the tester in response to the Q scan outputs. The clock generating unit receives a first clock signal of the clock frequency F1 from the tester and provides a second clock signal of the clock frequency F2 to the DUT. The second clock signal generated based on the first clock signal.

Other aspects and example embodiments are provided in the drawings and the detailed description that follows.

The drawings referred to in this description are not to be understood as being drawn to scale except if specifically noted, and such drawings are only for examples in nature.

DETAILED DESCRIPTION

In the following detailed description, numerous specific details are set forth in order to provide a thorough understanding of the present disclosure. However, the present disclosure may be practiced without these specific details. In other instances, well-known methods, procedures, components, and circuits have not been described in detail so as to not unnecessarily obscure aspects of the example embodiments presented herein. Moreover, it is noted that structures and devices are shown in block diagram form in order to avoid obscuring the disclosure.

Reference in this specification to "one embodiment" or "an embodiment" means that a particular feature, structure, or characteristic described in connection with the embodiment is included in at least one embodiment of the disclosure. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various parameters are described that may be parameters for some embodiments but not for other embodiments.

Various example embodiments of the present disclosure provide scan testing of device-under-test (DUT) for efficient utilization of tester resources (for example, I/O ports of a tester communicably coupled to the DUT for scan testing) and to enable test time reduction. In various example embodiments of the present disclosure, an adapter module is used within a test environment to efficiently utilize the tester resources, and to enable the scan testing of the DUT at the frequency of operation equal or higher than that of the tester thereby enabling test time reduction. Various example embodiments of the present disclosure are presented herein with reference to FIGS. 1 to 4.

Figure 1:
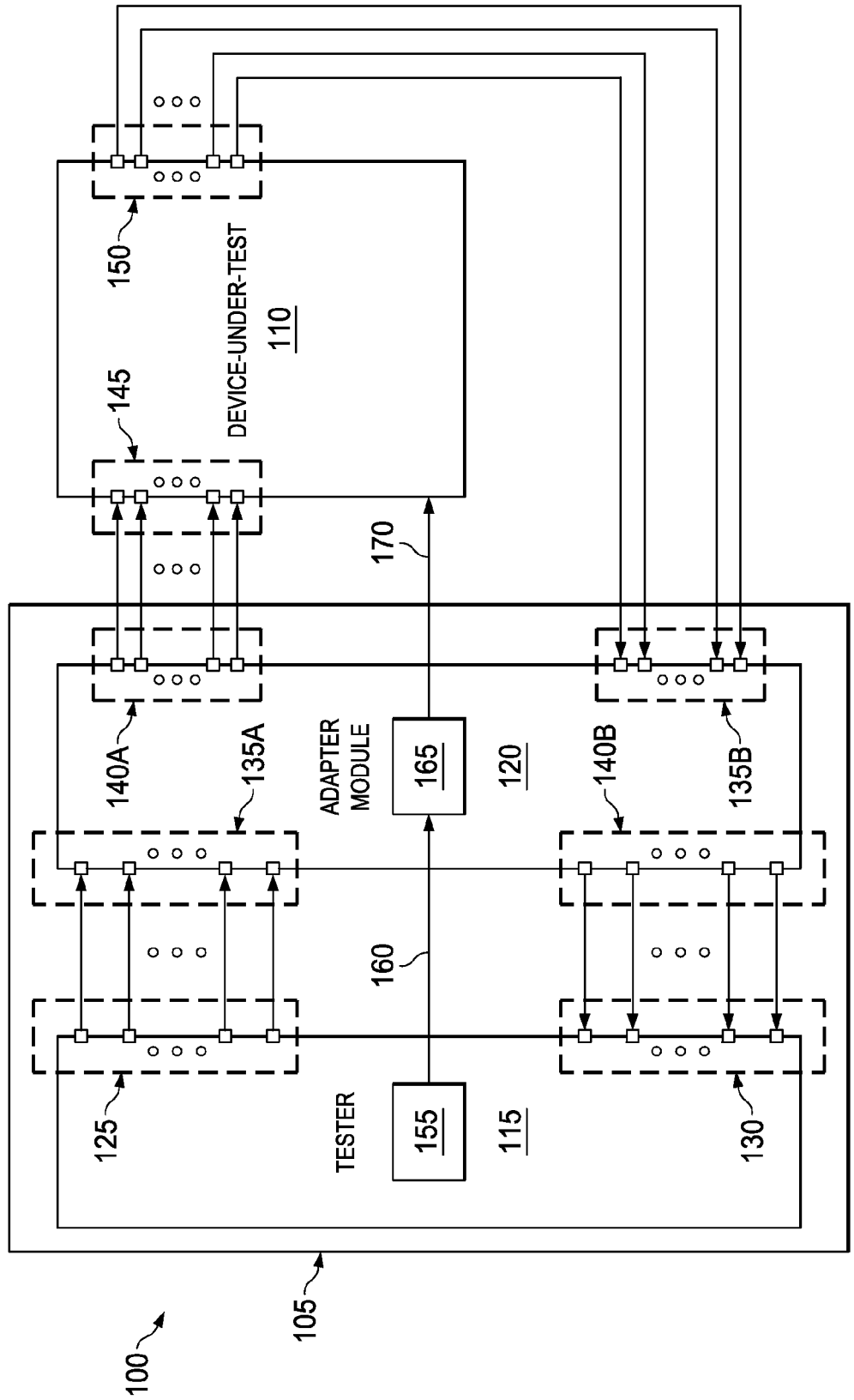
FIG. 1 is a block diagram of an example test environment, in which various example embodiments of the present disclosure can be implemented.

FIG. 1 is a block diagram of a test environment 100, where various example embodiments of the present disclosure can be implemented. In this broad level representation of FIG. 1, the test environment 100 is designed to test a device-under-test (DUT). The test environment 100 includes a test system 105 and a DUT 110. In an example, the DUT 110 is a semiconductor device, an application specific integrated circuit (ASIC), a field programmable gate array (FPGA), a programmable logic array (PLA), a printed circuit board (PCB), a dynamic random access memory, or any fabricated or modeled electrical or electronic device. In an embodiment, the DUT 110 includes a single device or a plurality of devices. Each device can have multiple circuits or components or modules that may be coupled to the test system 105 for performing scan testing of the device. The test system 105 includes a tester 115 and an adapter module 120. The tester 115 includes M tester Input/Output (I/O) ports 125 and N tester I/O ports 130. The adapter module 120 includes a plurality of input ports 135A and 135B and a plurality of output ports 140A and 140B. The DUT 110 includes P scan input ports 145 and Q scan output ports 150. The M tester I/O ports 125 of the tester 115 are coupled to the plurality of input ports 135A. The plurality of output ports 140A of the adapter module 120 are coupled to the P scan input ports 145 of the DUT 110. The Q scan output ports 150 of the DUT 110 are coupled to the plurality of input ports 135B of the adapter module 120. The plurality of output ports 140B of the adapter module 120 are coupled to the N tester I/O ports 130 of the tester 115.

In an example, the tester 115 can be considered as a very low cost tester (VLCT) that is capable of driving 8 scan inputs and sensing 8 scan outputs. In another example, the tester 115 can be a high-end tester that is capable of driving a higher number of inputs and outputs as compared to the VLCT. In an example embodiment, the tester 115 includes a clock generating unit 155 that generates a first clock signal 160 at a clock frequency F1 at which the tester 115 operates. In an example embodiment, the adapter module 120 includes a clock generating unit 165 that receives the first clock signal 160 of the clock frequency F1 from the tester 115 and generates a second clock signal 170 of the clock frequency F2 based on the first clock signal 160. The second clock signal 170 of the clock frequency F2 is provided to the DUT 110.

During scan testing, the tester 115 drives M scan inputs from the M tester I/O ports 125 at the clock frequency F1 and provides the M scan inputs to the adapter module 120. The adapter module 120 receives the M scan inputs at the plurality of input ports 135A at the clock frequency F1. The adapter module 120 further provides P scan inputs from the plurality of output ports 140A at a clock frequency F2 to the P scan input ports 145 of the DUT 110. The P scan inputs are provided in response to the M scan inputs. For example, the M scan inputs are assembled into the P scan inputs (with frequency conversion from the clock frequency F1 to the clock frequency F2) to be provided to the DUT 110. The DUT 110 further provides Q scan outputs from the Q scan output ports 150 at the clock frequency F2 to the plurality of input ports 135B of the adapter module 120.

The adapter module 120 further receives the Q scan outputs (from the Q scan output ports 150) at the plurality of input ports 135B at the clock frequency F2, and provides N scan outputs from the plurality of output ports 140B at the clock frequency F1 to the N tester I/O ports 130 of the tester 115. The N scan outputs are provided in response to the Q scan outputs. For example, the Q scan outputs are disassembled into the N scan outputs (with frequency conversion from the clock frequency F2 to the clock frequency F1) to be provided to the tester 115. A ratio of M to P is equal to a ratio of N to Q, and each of M, N, P and Q is a positive integer. Various example embodiments of the present disclosure enable scan testing of the DUT 110 so as to test the DUT 110 efficiently. For instance, by employing the adapter module 120, increased number of tester resources (for example, the M tester I/O ports 125 and the N tester I/O ports 130) can be utilized and the DUT 110 can be enabled to internally operate at the clock frequency similar to or more than that of the tester 115 (for example, frequency F1). Various example embodiments of scan testing the DUT 110 by the test system 105 in a plurality of configurations are further described in reference to FIGS. 2 to 4.

Figure 2:
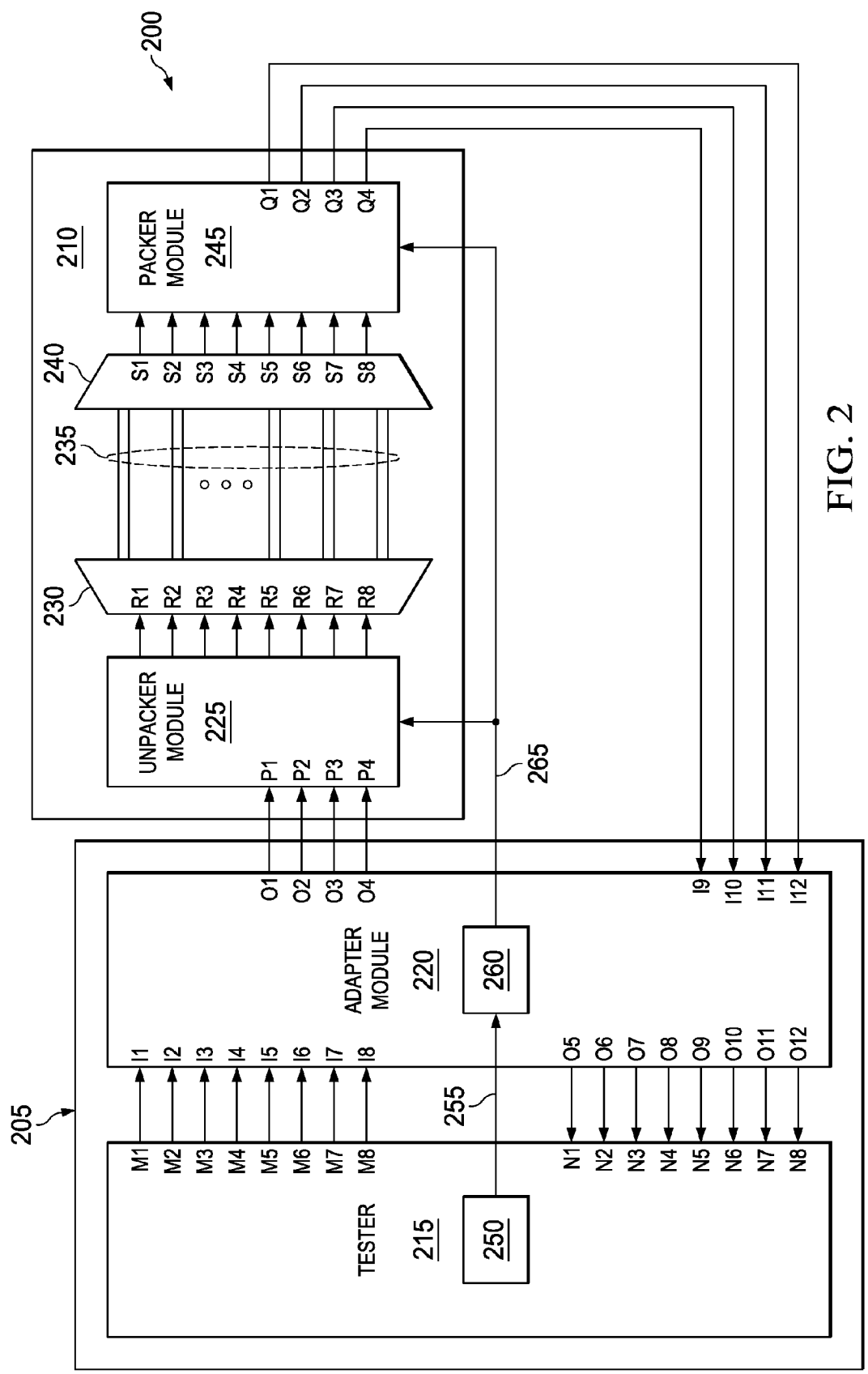
FIG. 2 is a block diagram of a test environment, in accordance with an example embodiment of the present disclosure.

FIG. 2 is a block diagram of a test environment 200, in accordance with an example embodiment. The test environment 200 includes a test system 205 coupled to a DUT 210. The test system 205 includes a tester 215 and an adapter module 220. The DUT 210 includes an unpacker module 225, a decompressor module 230, and a plurality of scan channels 235, a compressor module 240, and a packer module 245.

The tester 215 includes M tester I/O ports, for example 8 tester I/O ports M1, M2, M3, M4, M5, M6, M7 and M8. The tester 215 also includes N tester I/O ports, for example 8 tester I/O ports N1, N2, N3, N4, N5, N6, N7 and N8. The adapter module 220 includes a plurality of input ports, for example 12 input ports I1, I2, I3, I4, I5, I6, I7, I8, I9, I10, I11, and I12, and a plurality of output ports, for example 12 output ports O1, O2, O3, O4, O5, O6, O7, O8, O9, O10, O11, and O12. The unpacker module 225 of the DUT 210 includes P scan input ports, for example 4 scan input ports P1, P2, P3 and P4. The decompressor module 230 includes R ports, for example 8 ports R1, R2, R3, R4, R5, R6, R7 and R8. The compressor module 240 includes S ports, for example 8 ports S1, S2, S3, S4, S5, S6, S7 and S8. The packer module 245 includes Q scan output ports, for example 4 scan output ports Q1, Q2, Q3 and Q4.

The M tester I/O ports (M1-M8) of the tester 215 are coupled to the plurality of input ports (I1-I8) of the adapter module 220. The plurality of output ports (O1-O4) of the adapter module 220 is coupled to the P scan input ports (P1-P4) of the unpacker module 225. The unpacker module 225 is coupled to the R ports (R1-R8) of the decompressor module 230 at an input of the decompressor module 230. An output of the decompressor module 230 is coupled to one end of the plurality of scan channels 235 for providing scan inputs. Another end of the plurality of scan channels 235 is coupled to an input of the compressor module 240 for providing scan outputs. The plurality of scan channels 235 are also referred to as scan chains that include memory elements, for example flip-flops or latches. During scan testing, data is shifted through the memory elements and different states of the DUT 110 can thereby be observed and controlled by the tester 215. An output of the compressor module 240 including S ports (S1-S8) is coupled to the packer module 245. The packer module 245 includes Q scan output ports (Q1-Q4) coupled to the plurality of input ports (I9-I12) of the adapter module 220. The plurality of output ports (O5-O12) of the adapter module 220 are coupled to the N tester I/O ports (N1-N8) of the tester 215.

In an example embodiment, the tester 215 includes a clock generating unit 250 that generates a first clock signal 255 at a clock frequency F1 at which the tester 215 operates. In an example embodiment, the adapter module 220 includes a clock generating unit 260 that receives the first clock signal 255 of the clock frequency F1 from the tester 215 and generates a second clock signal 265 of the clock frequency F2 based on the first clock signal 255. The second clock signal 265 of the clock frequency F2 is provided to the DUT 210, for example the unpacker module 225 and the packer module 245.

As illustrated in FIG. 2, during the scan testing, the tester 215 drives eight M scan inputs (that are parallel scan inputs) from the M tester I/O ports (M1-M8) at the clock frequency F1 and provides the eight M scan inputs to the adapter module 220. The adapter module 220 receives the eight M scan inputs from the M tester I/O ports (M1-M8) at the plurality of input ports (I1-I8) at the clock frequency F1. The adapter module 220 assembles the eight M scan inputs into four P scan inputs (with frequency conversion from the clock frequency F1 to a clock frequency F2). The four P scan inputs are provided from the output ports (O1-O4) to the P scan input ports (P1-P4) of the unpacker module 225, at the clock frequency F2. In an example embodiment, the clock generating unit 260 of the adapter module 220 generates the clock frequency F2 by multiplying the clock frequency F1 by a ratio (M/P), for example (M/P)=(8/4)=2, an integer value. Hence, if the clock frequency F1 is 30 Mega Hertz (MHz), the adapter module 220 generates the clock frequency F2 at 60 MHz for (M/P)=2 (for example, 30 MHz*2=60 MHz).

In an example embodiment, the unpacker module 225 is configured to unpack one input to the unpacker module 225 at the clock frequency F2 into k outputs at the clock frequency F3, where k is a ratio and can be any integer value, for example k is 2. In the example embodiment of FIG. 2, as the ratio k is an integer value 2, the unpacker module 225 is a deserializer. Hence, for each input to the unpacker module 225, there are two outputs from the unpacker module 225 for k=2. The four P scan inputs received by the unpacker module 225 at the clock frequency F2 are thereby unpacked into eight R pseudo scan inputs at a clock frequency F3. In this example embodiment, the clock frequency F3 is generated by dividing the clock frequency F2 by the ratio k (F3=F2/k). Hence, if the clock frequency F2 at 60 MHz is divided by k=2, the clock frequency F3 is generated at 30 MHz. In this case, the clock frequency F1 of the tester 215 is equal to the clock frequency F3 (internal shift frequency of the DUT 210), for example 30 MHz, as the ratio (M/P) and the ratio k are equal to 2. The eight R pseudo scan inputs are received at the R ports (R1-R8) of the decompressor module 230. The decompressor module 230 decompresses the eight R pseudo scan inputs into a plurality of scan inputs. In an example, the eight R pseudo scan inputs are decompressed into $8*2^7$ or 1024 scan inputs. The plurality of scan channels 235 receives the plurality of scan inputs and provides a plurality of scan outputs. In some forms, number of the plurality of scan inputs is equal to number of the plurality of scan outputs, for example 1024 scan outputs, however, it can be different as well.

The compressor module 240 receives the plurality of scan outputs and compresses the plurality of scan outputs into eight S pseudo scan outputs. The eight S pseudo scan outputs are provided from the S ports (S1-S8) of the compressor module 240 to the packer module 245. The packer module 245 receives the eight S pseudo scan outputs at the clock frequency F3 (for example, 30 MHz) and packs the eight S pseudo scan outputs into four Q scan outputs at the clock frequency F2 (for example, 60 MHz). In this example embodiment, the packer module 245 is configured to perform packing of k inputs of the packer module 245 at the clock frequency F3 into 1 output at the clock frequency F2, such that 1*F2=k*F3, and where k is a ratio and can be any integer value, for example k=2. In the example embodiment of FIG. 2, as the ratio k is an integer value 2, the packer module 245 is a serializer. Hence, for every two inputs to the packer module 245, there is one output from the packer module 245 for k=2. The eight S pseudo scan inputs received by the packer module 245 are thereby packed into four Q scan outputs at the clock frequency F2 (for example, 60 MHz).

The adapter module 220 receives the four Q scan outputs from the Q scan output ports (Q1-Q4) at the plurality of input ports (I9-I12) at the clock frequency F2. The adapter module 220 disassembles the four Q scan outputs into eight N scan outputs (with frequency conversion from the clock frequency F2 to the clock frequency F1). The eight N scan outputs are provided from the plurality of output ports (O5-O12) at the clock frequency F1 to the N tester I/O ports (N1-N8) of the tester 215. The adapter module 220 performs the conversion of Q scan outputs into N scan outputs by a ratio of (Q/N), for example (Q/N)=(4/8)=1/2, and hence the N scan outputs are provided at the clock frequency F1 of 30 MHz to the I/O ports (N1-N8) of the tester 215.

In this example implementation, a ratio of M to P is equal to a ratio of N to Q, and each of M, N, P and Q is a positive integer. In this example, the M scan inputs and the N scan outputs of the tester 215 are greater than the P scan inputs and the Q scan outputs of the DUT 210, respectively, for example eight M scan inputs are greater than four P scan inputs and eight N scan outputs are greater than four Q scan outputs. It should be appreciated that by employing the adapter module 220, a higher number of I/O ports of the tester 215 are used to provide scan inputs to the available scan input ports of the DUT 210, for example 8 tester I/O ports provide scan inputs to 4 scan input ports of the DUT 210. Similarly, a higher number of I/O ports of the tester 215 are used to receive scan outputs from the available scan output ports of the DUT 210, for example 8 tester I/O ports receive scan outputs from 4 scan output ports of the DUT 210.

In another example configuration, the adapter module 220 receives the eight M scan inputs (that are parallel scan inputs) from the M tester I/O ports (M1-M8) at the plurality of input ports (I1-I8) at the clock frequency F1. The adapter module 220 assembles the eight M scan inputs into three P scan inputs (with frequency conversion from the clock frequency F1 to a clock frequency F2). The three P scan inputs are provided from the plurality of output ports (O1-O3) to the P scan input ports (P1-P3) of the unpacker module 225, at the clock frequency F2. In an example embodiment, the clock generating unit 260 of the adapter module 220 generates the clock frequency F2 by multiplying the clock frequency F1 by a ratio (M/P), for example (M/P)=8/3, a fractional value. Hence, if the clock frequency F1 is 30 Mega Hertz (MHz), the adapter module 220 generates the clock frequency F2 at 80 MHz for (M/P)=8/3 (for example, 30 MHz*8/3=80 MHz).

In this example embodiment, the unpacker module 225 is configured to unpack inputs of the unpacker module 225 into outputs such that number of outputs are equal to k times of number of inputs, where k is a ratio and can be a fractional value, for example k is 8/3. In the example embodiment of FIG. 2, as the ratio k is the fractional value 8/3, the unpacker module 225 acts as a fractional data packing module. Hence, three P scan inputs received by the unpacker module 225 at the clock frequency F2 are thereby unpacked into eight R pseudo scan inputs at a clock frequency F3. In this example embodiment, the clock frequency F3 is equal to 1/k times of the clock frequency F2 (for example, F3=F2/k). Hence, if the clock frequency F2 is 80 MHz, the clock frequency F3 is 30 MHz. In this case, the clock frequency F1 of the tester 215 is equal to the clock frequency F3 (internal shift frequency of the DUT 210), for example 30 MHz, as each of the ratio (M/P) and the ratio k are equal to (8/3). The eight R pseudo scan inputs are received at the R ports (R1-R8) of the decompressor module 230. The decompressor module 230 decompresses the eight R pseudo scan inputs into a plurality of scan inputs. In an example, the eight R pseudo scan inputs are decompressed into 8*2$^7$ or 1024 scan inputs. The plurality of scan channels 235 receives the plurality of scan inputs and provides a plurality of scan outputs.

The compressor module 240 receives the plurality of scan outputs and compresses the plurality of scan outputs into eight S pseudo scan outputs. The eight S pseudo scan outputs are provided from the S ports (S1-S8) of the compressor module 240 to the packer module 245. The packer module 245 receives the eight S pseudo scan outputs at the clock frequency F3 (for example, 30 MHz) and packs the eight S pseudo scan outputs into three Q scan outputs at the clock frequency F2 (for example, 80 MHz). In this example embodiment, the packer module 245 is configured to pack inputs of the packer module 245 into outputs such that number of outputs is equal to 1/k times of number of inputs (where k is a ratio and can be a fractional value, for example k is 8/3). In the example embodiment of FIG. 2, as the ratio k is a fractional value 8/3, the packer module 245 acts as a reverse fractional data packing module. Accordingly, eight S pseudo scan inputs received by the packer module 245 (at clock frequency 30 MHz) are packed into three Q scan outputs at the clock frequency F2 (for example, 80 MHz).

The adapter module 220 receives the three Q scan outputs from the Q scan output ports (Q1-Q3) at the plurality of input ports (I9-I11) at the clock frequency F2. The adapter module 220 disassembles the three Q scan outputs into eight N scan outputs (with frequency conversion from the clock frequency F2 to the clock frequency F1). The eight N scan outputs are provided from the plurality of output ports (O5-O12) at the clock frequency F1 to the N tester I/O ports (N1-N8) of the tester 215. The adapter module 220 performs the conversion of Q scan outputs into N scan outputs by a ratio of (Q/N), for example (Q/N)=3/8, and hence the N scan outputs are provided at the clock frequency F1 of 30 MHz to the I/O ports (N1-N8) of the tester 215, and thereafter the scan outputs are analysed to perform testing of the DUT 210.

In the example configurations provided above, a ratio of M (number of scan inputs generated from the tester 215) to P (number of scan inputs received at the DUT 210) is equal to a ratio of N (number of scan outputs received at the tester 215) to Q (number of scan outputs generated from the DUT 210), and each of M, N, P and Q is a positive integer. Further, M is greater than P and N is greater than Q. For example M and N are 8 and P and Q are 4. In another example, M and N are 8 and P and Q are 3. It should be noted that, in absence of the adapter module 220, the scan input ports of the DUT 210 are driven by same number of tester resources, for example, a DUT having 4 scan input ports and 4 scan output ports would receive 4 scan inputs from only 4 tester I/O ports (out of 8 tester I/O ports of a VLCT) and provide 4 scan outputs to only 4 tester I/O ports (out of 8 tester I/O ports of a VLCT), respectively. As remaining tester I/O ports would be unused, a frequency of operation of the DUT is limited much below its capability (for example, 1/k times the clock frequency F1=30 MHz/2=15 MHz which is less than the clock frequency F1 of the tester). It should be appreciated that by employing the adapter module 220, a higher number of I/O ports of the tester 215 are used to provide scan inputs to the available scan input ports of the DUT 210, for example, 8 tester I/O ports provide 4 scan inputs to 4 scan input ports of the DUT 210. Similarly, a higher number of I/O ports of the tester 215 are used to receive scan outputs from the available scan output ports of the DUT 210, for example, 8 tester I/O ports receive 4 scan outputs from 4 scan output ports of the DUT 210. In an example, the frequency of operation of the DUT 210 can be made similar to that of the clock frequency F1 of the tester 215.

In the example configurations provided above, a ratio of M (number of scan inputs generated from the tester 215) to P (number of scan inputs received at the DUT 210) is equal to a ratio of N (number of scan outputs received at the tester 215) to Q (number of scan outputs generated from the DUT 210), and each of M, N, P and Q is a positive integer. Further, M is greater than P and N is greater than Q. For example, M and N are 8 and P and Q are 4; and M and N are 8 and P and Q are 3. It should be apparent to those skilled in the art that in absence of the adapter module 220, the scan input ports of the DUT 210 would receive scan inputs from same number of tester I/O ports of the tester 215, for example, 4 I/O ports of the DUT 201 would receive scan inputs from only 4 I/O ports of the tester 215. However, by employing the adapter module 225, connections between the DUT 210 and the tester 215 can be customized, and increased number of tester resources of the tester 215, for example, I/O ports, for providing scan inputs and for receiving scan outputs can be used. For example, if various example embodiments of the present disclosure are not used (for example, the adapter module 225 is not present), each of M and P is equal to 4, each of the N and Q is 4, and if remaining tester I/O ports are unused, a frequency of operation of the DUT is limited much below its capability (for example, 1/k times the clock frequency F1=30 MHz/2=15 MHz which is even less than the clock frequency F1 of the tester). Accordingly, it should be appreciated that by employing the adapter module 220, a higher number of I/O ports of the tester 215 are used to provide scan inputs to the available scan input ports of the DUT 210, for example 8 tester I/O ports provide 4 scan inputs to 4 scan input ports of the DUT 210. Similarly, a higher number of I/O ports of the tester 215 are used to receive scan outputs from the available scan output ports of the DUT 210, for example 8 tester I/O ports receive 4 scan outputs from 4 scan output ports of the DUT 210.

It should be understood that the tester 215, the adapter module 220, and the DUT 210 are shown as representative purposes and can have different configurations and can include additional components than those shown in FIG. 2.

In this example embodiment, values of M and N are taken as equal and also P and Q are equal, and R (number of pseudo scan inputs) and S (number of pseudo scan outputs) are also equal to M and N. Various example embodiments of the present disclosure are also applicable in configurations where M is not equal to P. An example configuration of a test environment including an adapter module where the M and N are unequal, and P and Q are unequal, is described with reference to FIG. 3.

Figure 3:
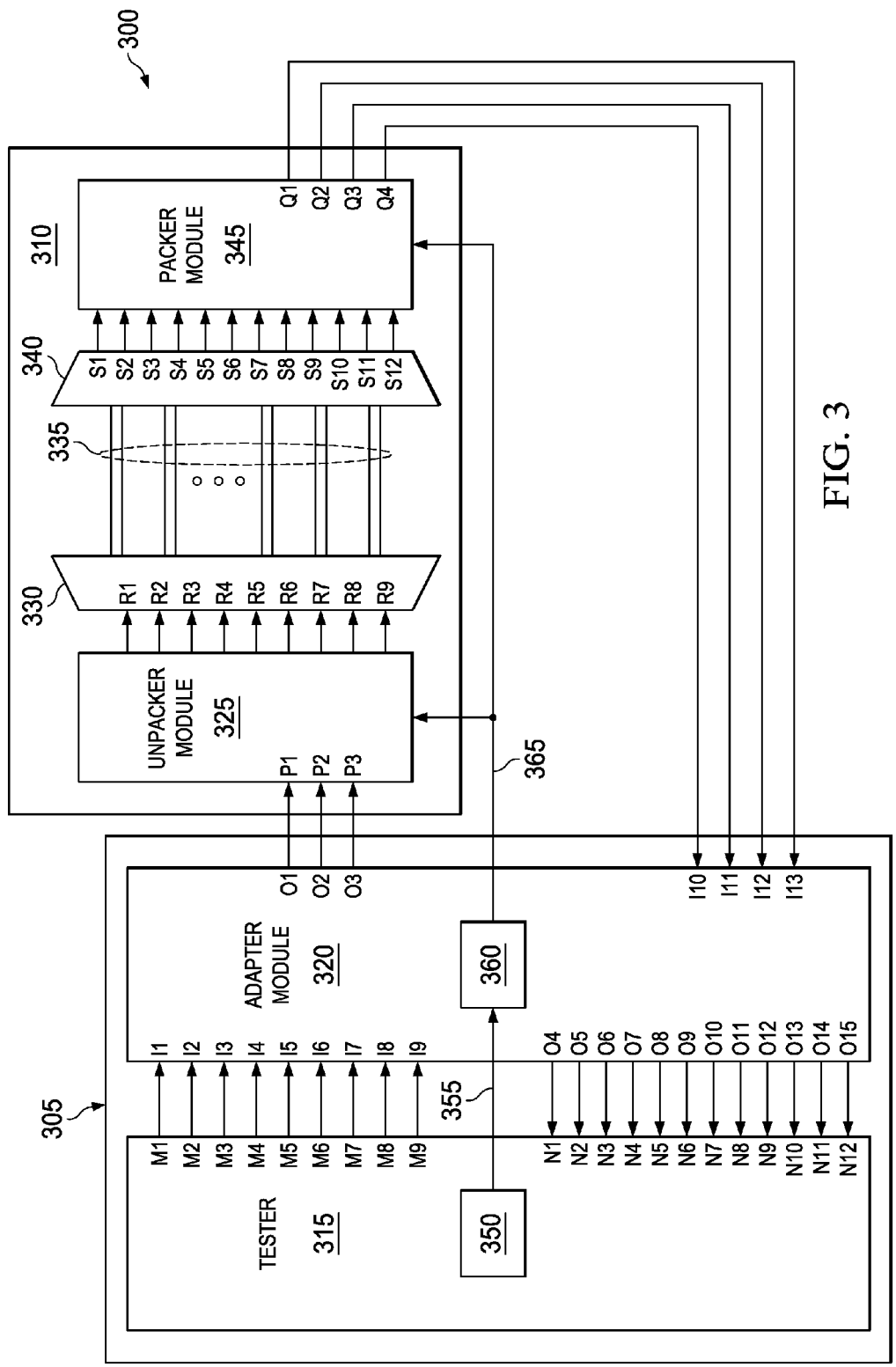
FIG. 3 is a block diagram of a test environment, in accordance with another example embodiment of the present disclosure.

FIG. 3 is a block diagram of a test environment 300, in accordance with an example embodiment. The test environment 300 includes a test system 305 coupled to a DUT 310. The test system 305 includes a tester 315 and an adapter module 320. The DUT 310 includes an unpacker module 325, a decompressor module 330, a plurality of scan channels 335, a compressor module 340, and a packer module 345.

The tester 315 includes M tester I/O ports, for example 9 tester I/O ports (M1-M9). The tester 315 also includes N tester I/O ports, for example 12 tester I/O ports (N1-N12). The adapter module 320 includes a plurality of input ports, for example 13 input ports (I1-I13), and a plurality of output ports, for example 15 output ports (O1-O15). The unpacker module 325 of the DUT 310 includes P scan input ports, for example 3 scan input ports P1, P2 and P3. The decompressor module 330 includes R ports, for example, 9 ports (R1-R9). The compressor module 340 includes S ports, for example 12 ports (S1-S12). The packer module 345 includes Q scan output ports, for example, 4 scan output ports Q1, Q2, Q3 and Q4.

The M tester I/O ports (M1-M9) of the tester 315 are coupled to the input ports (I1-I9) of the adapter module 320. The output ports (O1-O3) of the adapter module 320 are coupled to the P scan input ports (P1-P3) of the unpacker module 325. The unpacker module 325 is coupled to the R ports (R1-R9) of the decompressor module 330 at an input of the decompressor module 330. An output of the decompressor module 330 is coupled to one end of the plurality of scan channels 335 for providing scan inputs. Another end of the plurality of scan channels 335 is coupled to an input of the compressor module 340 for providing scan outputs. An output of the compressor module 340 including S ports (S1-S12) is coupled to the packer module 345. The packer module 345 includes Q scan output ports (Q1-Q4) coupled to the plurality of input ports (I10-I13) of the adapter module 320. The plurality of output ports (O4-O15) of the adapter module 320 are coupled to the N tester I/O ports (N1-N12) of the tester 315.

In an example embodiment, the tester 315 includes a clock generating unit 350 that generates a first clock signal 355 at a clock frequency F1 at which the tester 315 operates. In an example embodiment, the adapter module 320 includes a clock generating unit 360 that receives the first clock signal 355 of the clock frequency F1 from the tester 315 and generates a second clock signal 365 of the clock frequency F2 based on the first clock signal 355. The second clock signal 365 of the clock frequency F2 is provided to the DUT 310, for example, the unpacker module 325 and the packer module 345.

As illustrated in FIG. 3, during scan testing, the tester 315 drives nine M scan inputs (that are parallel scan inputs) from the M tester I/O ports (M1-M9) at the clock frequency F1 and provides the nine M scan inputs to the adapter module 320. The adapter module 320 receives the nine M scan inputs from the M tester I/O ports (M1-M9) at the plurality of input ports (I1-I9) at the clock frequency F1. The adapter module 320 assembles the nine M scan inputs into three P scan inputs (with frequency conversion from the clock frequency F1 to the clock frequency F2). The three P scan inputs are provided from the plurality of output ports (O1-O3) to the P scan input ports (P1-P3) of the unpacker module 325, at the clock frequency F2. In an example embodiment, the clock generating unit 360 of the adapter module 320 generates the clock frequency F2 by multiplying the clock frequency F1 by a ratio (M/P) of 3 (for example (M/P)=9/3). Hence, if the clock frequency F1 is 30 Mega Hertz (MHz), the adapter module 320 generates the clock frequency F2 at 90 MHz.

In an example embodiment, the unpacker module 325 is configured to unpack one input of the unpacker module 325 at the clock frequency F2 into k outputs at the clock frequency F3, where k is a ratio and can be any integer value, for example, k is 3. In the example embodiment of FIG. 3, as the ratio k is an integer value 3, the unpacker module 225 acts as a deserializer. Hence, for each input to the unpacker module 325, there are three outputs from the unpacker module 325 if the value of k is configured as 3. The three P scan inputs received by the unpacker module 325 at the clock frequency F2 are thereby unpacked into nine R pseudo scan inputs at a clock frequency F3. In this example embodiment, the clock frequency F3 is generated by dividing the clock frequency F2 by the ratio k (F3=F2/k). Hence, if the clock frequency F2 at 90 MHz is divided by k=3, the clock frequency F3 is generated at 30 MHz. In this case, the clock frequency F1 of the tester 315 is equal to the clock frequency F3 (internal shift frequency of the DUT 310), for example 30 MHz, as the ratio (M/P) and the ratio k are equal to 3. The nine R pseudo scan inputs are received at the R ports (R1-R9) of the decompressor module 330. The decompressor module 330 decompresses the nine R pseudo scan inputs into a plurality of scan inputs. In an example, the nine R pseudo scan inputs are decompressed into 9*2$^8$ or 2304 scan inputs. The plurality of scan channels 335 receives the plurality of scan inputs and provides a plurality of scan outputs. In some forms, number of the plurality of scan inputs is equal to number of the plurality of scan outputs, for example 2304 scan outputs, however, it can be different as well.

The compressor module 340 receives the plurality of scan outputs and compresses the plurality of scan outputs into twelve S pseudo scan outputs. The twelve S pseudo scan outputs are provided from the S ports (S1-S12) of the compressor module 340 to the packer module 345. The packer module 345 receives the twelve S pseudo scan outputs at the clock frequency F3 (for example, 30 MHz) and packs the twelve S pseudo scan outputs into four Q scan outputs at the clock frequency F2 (for example, 90 MHz). In this example embodiment, the packer module 345 is configured to pack k inputs of the packer module 345 at the clock frequency F3 into 1 output at the clock frequency F2, such that 1*F2=k*F3, where k is a ratio and can be any integer value, for example k=3. In the example embodiment of FIG. 3, as the ratio k is an integer value 3, the packer module 345 is a serializer. Hence, for every three inputs to the packer module 345, there is one output from the packer module 345 for k=3. The twelve S pseudo scan inputs received by the packer module 345 are thereby packed into four Q scan outputs at the clock frequency F2 (for example, 90 MHz).

The adapter module 320 receives the four Q scan outputs from the Q scan output ports (Q1-Q4) at the plurality of input ports (I11-I13) at the clock frequency F2. The adapter module 320 disassembles the four Q scan outputs into twelve N scan outputs (with frequency conversion from the clock frequency F2 to the clock frequency F1). The twelve N scan outputs are provided from the plurality of output ports (O4-O15) at a clock frequency F1 to the N tester I/O ports (N1-N12) of the tester 315. The adapter module 320 performs the conversion of Q scan outputs into N scan outputs by a ratio of (Q/N), for example (Q/N)=(4/12)=1/3, and hence the N scan outputs are provided at the clock frequency F1 of 30 MHz to the I/O ports (N1-N12) of the tester 315.

In this example implementation, a ratio of M to P is equal to a ratio of N to Q, and each of M, N, P and Q is a positive integer. In this example, the M scan inputs and the N scan outputs of the tester 315 are greater than the P scan inputs and the Q scan outputs of the DUT 310, respectively. For example nine M scan inputs are greater than three P scan inputs and twelve N scan outputs are greater than four Q scan outputs. In some example embodiments, the M scan inputs are unequal to the R pseudo scan inputs, and the N scan outputs are unequal to the S pseudo scan outputs.

It should be understood that the tester 315, the adapter module 320, and the DUT 310 are shown as representative purposes and can include additional components than those shown in FIG. 3.

It will be noted that FIGS. 1 to 3 are provided for representation of example embodiments only, and should not be considered as limiting to the scope of the example embodiments. An example method of enabling scan testing of a DUT is explained further with reference to FIG. 4. It will be noted that for the description of the method in FIG. 4, various references will be made to the FIGS. 1-3 for explaining one or more embodiments of the method for enabling scan testing of the DUT.

Figure 4:
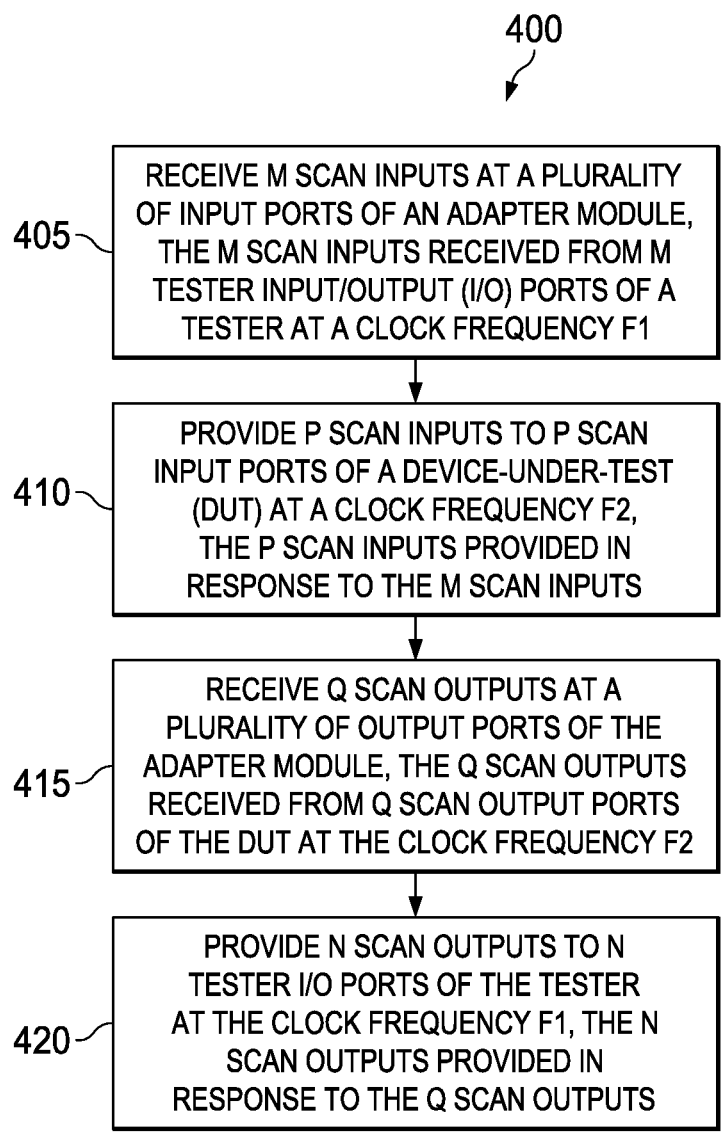
FIG. 4 illustrates a flowchart of an example method of enabling scan testing of a device-under-test, in accordance with an example embodiment of the present disclosure.

FIG. 4 illustrates a flowchart of an example method 400 of enabling scan testing of a device-under-test (DUT), for example the DUT 110 of FIG. 1, according to an example embodiment. As described in FIG. 1, the DUT includes P scan input ports and Q scan output ports, for example the P scan input ports 145 and the Q scan output ports 150.

At 405, M scan inputs are received at a plurality of input ports (for example, the plurality of input ports 135A of FIG. 1) of an adapter module (for example, the adapter module 120 of FIG. 1). The M scan inputs are received from M tester Input/Output (I/O) ports (for example, the M tester I/O ports 125 of FIG. 1) of a tester (for example the tester 115 of FIG. 1) at a clock frequency F1. Various examples of the M scan inputs are explained with reference to FIG. 2 and FIG. 3.

The adapter module further assembles the M scan inputs at the clock frequency F1 into P scan inputs at a clock frequency F2. In some example embodiments, the M scan inputs are greater than the P scan inputs.

In an example embodiment, the adapter module includes a clock generating unit (for example, a clock generating unit 165 of FIG. 1) that receives a first clock signal (for example, the first clock signal 160 of FIG. 1) of the clock frequency F1 from a clock generating unit (for example, the clock generating unit 155 of FIG. 1) of the tester. The clock generating unit further provides a second clock signal (for example, the second clock signal 170 of FIG. 1) of a clock frequency F2 to the DUT. The second clock signal is generated based on the first clock signal, for example F2=(M/P)*F1.

At 410, the P scan inputs are provided to the P scan input ports (for example the P scan input ports 145 of FIG. 1) of the DUT at the clock frequency F2. The P scan inputs are provided in response to the M scan inputs. The P scan inputs are provided from a plurality of output ports (for example, the plurality of output ports 140A of FIG. 1) of the adapter module. Various examples of the P scan inputs are explained with reference to FIG. 2 and FIG. 3.

The DUT including one or more components for performing the scan testing. For example, an unpacker module (for example, the unpacker module 225 of FIG. 2 or 325 of FIG. 3) of the DUT receives the P scan inputs from the adapter module at the P scan input ports. The unpacker module further unpacks the P scan inputs at the clock frequency F2 into R pseudo scan inputs at a frequency F3. In an example, the frequency F3 is an internal shift frequency and F3=F2/k, where k is a ratio associated with the unpacker module with which the unpacker module unpacks individual scan input into outputs. A decompressor module (for example, the decompressor module 230 of FIG. 2 or 330 of FIG. 3) decompresses the R pseudo scan inputs into a plurality of scan inputs. The plurality of scan inputs is provided to a plurality of scan channels (for example, the plurality of scan channels 235 of FIG. 2 or 335 of FIG. 3) and a plurality of scan outputs is obtained from the plurality of scan channels. A compressor module (for example, the compressor module 240 of FIG. 2 or 340 of FIG. 3) compresses the plurality of scan outputs into S pseudo scan outputs. A packer module (for example, the packer module 245 of FIG. 2 or 345 of FIG. 3) packs the S pseudo scan outputs at the clock frequency F3 into Q scan outputs at the clock frequency F2 (F2=F3*k). The packer module further provides the Q scan outputs from the Q scan output ports of the DUT to a plurality of output ports of the adapter module. The modules of the DUT and the scan testing are explained in detail with reference to FIG. 2 and FIG. 3.

At 415, the Q scan outputs are received at the plurality of output ports (for example, the plurality of output ports 135B of FIG. 1) of the adapter module. The Q scan outputs are received from the Q scan output ports (for example, the Q scan output ports 150 of FIG. 1) of the DUT at the clock frequency F2. Various examples of the Q scan outputs are explained with reference to FIG. 2 and FIG. 3.

The adapter module further disassembles the Q scan outputs at the clock frequency F2 into N scan outputs at the clock frequency F1. In some examples, the N scan outputs are greater than the Q scan outputs. At 420, the N scan outputs are provided to N tester I/O ports (for example, the N tester I/O ports 130 of FIG. 1) of the tester at the clock frequency F1. The N scan outputs are provided in response to the Q scan outputs. The N scan outputs are provided from a plurality of output ports (for example, the plurality of output ports 140B of FIG. 1) of the adapter module, as explained with reference to FIGS. 1 to 3.

Without in any way limiting the scope, interpretation, or application of the claims appearing below, advantages of one or more of the example embodiments disclosed herein include, scan throughput enhancement in scan testing of a device-under-test (DUT), especially a low pin count DUT, with efficient utilization of tester resources. Various example embodiments are capable of reducing test time of the DUT by implementing an adapter module for utilizing unused tester resources. The adapter module further enables the DUT to operate at an optimums frequency of the tester communicably thereby increasing a tester data rate and reducing the test time and cost. For instance, if a clock frequency of a VLCT is limited to 30 MHz, and DUTs (for example, CMOS IOs) have potential to work at 200 MHz, unused tester resources can be utilized to bring down the test time significantly. For example, if a DUT of 4 input ports is coupled to a tester having 8 ports that can provide scan inputs, then by utilizing the adapter module between the tester and the DUT, all 8 ports of the tester can be used to provide scan inputs to the 4 input ports of the DUT. Similarly, if a DUT of 4 output ports is coupled to a tester having 8 ports that can receive scan outputs, the adapter module also enables receipt of the scan outputs at the 8 ports of the tester from the 4 output ports of the DUT. Accordingly, various example embodiments provide enhancement of scan throughput of the scan testing of the DUT with the tester.

Further, DUT test clock (for example, the clock frequency F2) is derived from the adapter module so that the scan input/output data associated with tester, and scan input/output provided to or received from the DUT and clock signals operating in the test environment, are in synchronization. Various example embodiments provide generic solutions that utilize adapter modules that cause no interference in internal test architecture like CoDec.

Although the present disclosure has been described with reference to specific example embodiments, it is noted that various modifications and changes can be made to these embodiments without departing from the broad spirit and scope of the present disclosure. For example, the various circuits, etc., described herein can be enabled and operated using hardware circuitry (for example, complementary metal oxide semiconductor (CMOS) based logic circuitry), firmware, software and/or any combination of hardware, firmware, and/or software (for example, embodied in a machine-readable medium). For example, the various electrical structures and methods can be embodied using transistors, logic gates, and electrical circuits (for example, application specific integrated circuit (ASIC) circuitry and/or in Digital Signal Processor (DSP) circuitry).

Particularly, the adapter module 220 or 320 of FIGS. 2 and 3 may be enabled using transistors, logic gates, and electrical circuits (e.g., integrated circuit circuitry, such as, for example, ASIC circuitry). Embodiments of the present disclosure include one or more computer programs stored or otherwise embodied on a computer-readable medium, wherein the computer programs are configured to cause a processor to perform one or more operations, for method 400. A computer-readable medium storing, embodying, or encoded with a computer program, or similar language, may be embodied as a tangible data storage device storing one or more software programs that are configured to cause a processor to perform one or more operations. Such operations may be, for example, any of the steps or operations described herein. Additionally, a tangible data storage device may be embodied as one or more volatile memory devices, one or more non-volatile memory devices, and/or a combination of one or more volatile memory devices and non-volatile memory devices.

Also, techniques, devices, subsystems and methods described and illustrated in the various embodiments as discrete or separate can be combined or integrated with other systems, modules, techniques, or methods without departing from the scope of the present disclosure. Other items shown or discussed as directly coupled or communicating with each other can be coupled through some interface or device, such that the items can no longer be considered directly coupled to each other but can still be indirectly coupled and in communication, whether electrically, mechanically, or otherwise, with one another. Other examples of changes, substitutions, and alterations ascertainable by one skilled in the art, upon or subsequent to studying the example embodiments disclosed herein, can be made without departing from the spirit and scope of the present disclosure.

It is noted that the terminology "coupled to" does not necessarily indicate a direct physical relationship. For example, when two components are described as being "coupled to" one another, there may be one or more other devices, materials, etc., that are coupled between, attaching, integrating, etc., the two components. As such, the terminology "coupled to" shall be given its broadest possible meaning unless otherwise indicated.

It should be noted that reference throughout this specification to features, advantages, or similar language does not imply that all of the features and advantages should be or are in any single embodiment. Rather, language referring to the features and advantages can be understood to mean that a specific feature, advantage, or characteristic described in connection with an embodiment can be included in at least one embodiment of the present disclosure. Thus, discussions of the features and advantages, and similar language, throughout this specification can, but do not necessarily, refer to the same embodiment.

Various embodiments of the present disclosure, as discussed above, can be practiced with steps and/or operations in a different order, and/or with hardware elements in configurations which are different than those which are disclosed. Therefore, although the disclosure has been described based upon these example embodiments, it is noted that certain modifications, variations, and alternative constructions can be apparent and well within the spirit and scope of the disclosure. Although various example embodiments of the present disclosure are described herein in a language specific to structural features and/or methodological acts, the subject matter defined in the appended claims is not necessarily limited to the specific features or acts described above. Rather, the specific features and acts described above are disclosed as example forms of implementing the claims.

What is claimed is:

1. A test system for scan testing a device-under-test (DUT), the DUT comprising P scan input ports and Q scan output ports, the test system comprising:
    a tester configured to operate at a clock frequency F1, the tester comprising:
        M tester Input/Output (I/O) ports for providing M scan inputs at the clock frequency F1; and
        N tester I/O ports for receiving N scan outputs at the clock frequency F1; and
    an adapter module coupled to the tester, the adapter module configured to:
        receive the M scan inputs at the clock frequency F1 and provide P scan inputs at a clock frequency F2 to the P scan input ports of the DUT, the P scan inputs provided in response to the M scan inputs; and
        receive Q scan outputs at the clock frequency F2 from the Q scan output ports of the DUT and provide the N scan outputs at the clock frequency F1 to the N tester I/O ports of the tester, the N scan outputs provided in response to the Q scan outputs,
    wherein a ratio of M to P is equal to a ratio of N to Q, and wherein each of M, N, P and Q is a positive integer.

2. The test system of claim 1, wherein the adapter module comprises:
    a plurality of input ports for receiving the M scan inputs and the Q scan outputs;
    a plurality of output ports for providing the P scan inputs to the DUT and the N scan outputs to the tester; and
    a clock generating unit for receiving a first clock signal of the clock frequency F1 from the tester and for providing a second clock signal of the clock frequency F2 to the DUT, the second clock signal generated based on the first clock signal.

3. The test system of claim 2, wherein the DUT comprises:
    an unpacker module comprising the P scan input ports for receiving the P scan inputs at the clock frequency F2 from the adapter module, the unpacker module configured to unpack the P scan inputs into R pseudo scan inputs at a clock frequency F3;
    a decompressor module coupled to the unpacker module for receiving the R pseudo scan inputs, the decompressor module configured to decompress the R pseudo scan inputs into a plurality of scan inputs;
    a plurality of scan channels coupled with the decompressor module and configured to receive the plurality of scan inputs and provide a plurality of scan outputs;
    a compressor module coupled to the plurality of scan channels to receive the plurality of scan outputs, the compressor module configured to compress the plurality of scan outputs into S pseudo scan outputs; and
    a packer module coupled to the compressor module, the packer module configured to receive the S pseudo scan outputs and pack the S pseudo scan outputs at the clock frequency F3 into the Q scan outputs at the clock frequency F2, wherein the S and the Q are positive integers.

4. The test system of claim 3, wherein the M is greater than the P and the N is greater than the Q.

5. The test system of claim 3, wherein the M is equal to the N and the P is equal to the Q.

6. The test system of claim 2, wherein each of the M and the N is 8 and each of the P and Q is 4.

7. The test system of claim 6, wherein the clock frequency F2 is twice of the clock frequency F1.

8. A method of enabling scan testing of a device-under-test (DUT), the DUT comprising P scan input ports and Q scan output ports, the method comprising:
   receiving M scan inputs at a plurality of input ports of an adapter module, the M scan inputs received from M tester Input/Output (I/O) ports of a tester at a clock frequency F1;
   providing P scan inputs to the P scan input ports of the DUT at a clock frequency F2, the P scan inputs provided in response to the M scan inputs;
   receiving Q scan outputs at a plurality of output ports of the adapter module, the Q scan outputs received from the Q scan output ports of the DUT at the clock frequency F2; and
   providing N scan outputs to N tester I/O ports of the tester at the clock frequency F1, the N scan outputs provided in response to the Q scan outputs.

9. The method of claim 8, further comprising:
   receiving, at the adapter module, a first clock signal of the clock frequency F1 from the tester; and
   providing, by the adapter module, a second clock signal of the clock frequency F2 to the DUT, the second clock signal generated based on the first clock signal.

10. The method of claim 9, further comprising:
    receiving the P scan inputs from the plurality of input ports of the adapter module at the P scan input ports of the DUT;
    unpacking the P scan inputs at the clock frequency F2 into R pseudo scan inputs at a clock frequency F3;
    decompressing the R pseudo scan inputs into a plurality of scan inputs;
    converting the plurality of scan inputs into a plurality of scan outputs on a plurality of scan channels;
    compressing the plurality of scan outputs into S pseudo scan outputs;
    packing the S pseudo scan outputs at the clock frequency F3 into the Q scan outputs at the clock frequency F2; and
    providing the Q scan outputs from the Q scan output ports of the DUT to the plurality of output ports of the adapter module, wherein the S and the Q are positive integers.

11. The method of claim 10, wherein the M is greater than the P and the N is greater than the Q.

12. The method of claim 10, wherein the M is equal to the N and the P is equal to the Q.

13. The method of claim 10, wherein each of the M and the N is 8 and each of the P and Q is 4.

14. The method of claim 10, wherein the clock frequency F2 is twice of the clock frequency F1.

15. An adapter module for enabling scan testing of a device-under-test (DUT), the DUT comprising P input ports and Q scan output ports, the adapter module comprising:
    a plurality of input ports configured to receive M scan inputs at a clock frequency F1 from M tester Input/Output (I/O) ports of a tester, and to receive Q scan outputs at a clock frequency F2 from the Q scan output ports of the DUT;
    a plurality of output ports configured to provide P scan inputs at the clock frequency F2 to the P scan input ports of the DUT in response to the M scan inputs, and to provide N scan outputs at the clock frequency F1 to N tester I/O ports of the tester in response to the Q scan outputs; and
    a clock generating unit for receiving a first clock signal of the clock frequency F1 from the tester and for providing a second clock signal of the clock frequency F2 to the DUT, the second clock signal generated based on the first clock signal.

16. The adapter module of claim 15, wherein the DUT comprises:
    an unpacker module comprising the P scan input ports for receiving the P scan inputs at the clock frequency F2 from the adapter module, the unpacker module configured to unpack the P scan inputs into R pseudo scan inputs at a clock frequency F3;
    a decompressor module coupled to the unpacker module for receiving the R pseudo scan inputs, the decompressor module configured to decompress the R pseudo scan inputs into a plurality of scan inputs;
    the plurality of scan channels coupled with the decompressor module and configured to receive the plurality of scan inputs and provide a plurality of scan outputs;
    a compressor module coupled to the plurality of scan channels to receive the plurality of scan outputs, the compressor module configured to compress the plurality of scan outputs into S pseudo scan outputs; and
    a packer module coupled to the compressor module to receive the S pseudo scan outputs, the packer module further configured to pack the S pseudo scan outputs at the clock frequency F3 into the Q scan outputs at the clock frequency F2, wherein the S and the Q are positive integers.

17. The adapter module of claim 15, wherein the M is greater than the P and the N is greater than the Q.

18. The adapter module of claim 15, wherein the M is equal to the N and the P is equal to the Q.

19. The adapter module of claim 15, wherein each of the M and the N is 8 and each of the P and Q is 4.

20. The adapter module of claim 15, wherein the clock frequency F2 is twice of the clock frequency F1.

* * * * *